United States Patent [19]

Taranowski et al.

[11] Patent Number: 5,559,665
[45] Date of Patent: Sep. 24, 1996

[54] CAPACITIVE SWITCHING ASSEMBLY

[75] Inventors: Michael G. Taranowski, Greendale; Douglas E. Wickert, Pewaukee; Ruth E. Hubbell, Milwaukee; Denis J. Leveque, Milwaukee; Michael R. Larsen, Milwaukee, all of Wis.

[73] Assignee: Eaton Corporation, Cleveland, Ohio

[21] Appl. No.: 386,586

[22] Filed: Feb. 10, 1995

[51] Int. Cl.⁶ ............................. H01G 5/01; H01G 5/16
[52] U.S. Cl. ............................. 361/280; 361/288; 361/322
[58] Field of Search .................................. 361/280, 288, 361/287, 320, 321.3, 323

[56] References Cited

U.S. PATENT DOCUMENTS 4,423,464  12/1983  Tamura et al. .................. 361/288
4,472,758   9/1984  Goto et al. ...................... 361/288

Primary Examiner—Leo P. Picard
Assistant Examiner—Anthony Dinkins
Attorney, Agent, or Firm—Roger A. Johnston

[57] ABSTRACT

A capacitance change switch with a resiliently deformable conductive pad compressible against a dielectric coating on the surface of a pair of spaced coplanar thin foil plates formed on a refractory substrate. The pad forms with the plates a pair of capacitors electrically in series. User movement of an actuator causes pad compression and a significant electrically detectable change in capacitance for effecting a switching function. In one embodiment the pad is formed of conductive elastomer and in another embodiment the pad is formed of non-conductive elastomer with a conductive foil covering.

6 Claims, 3 Drawing Sheets

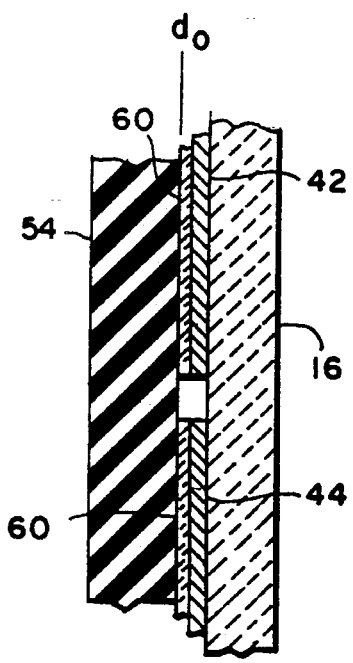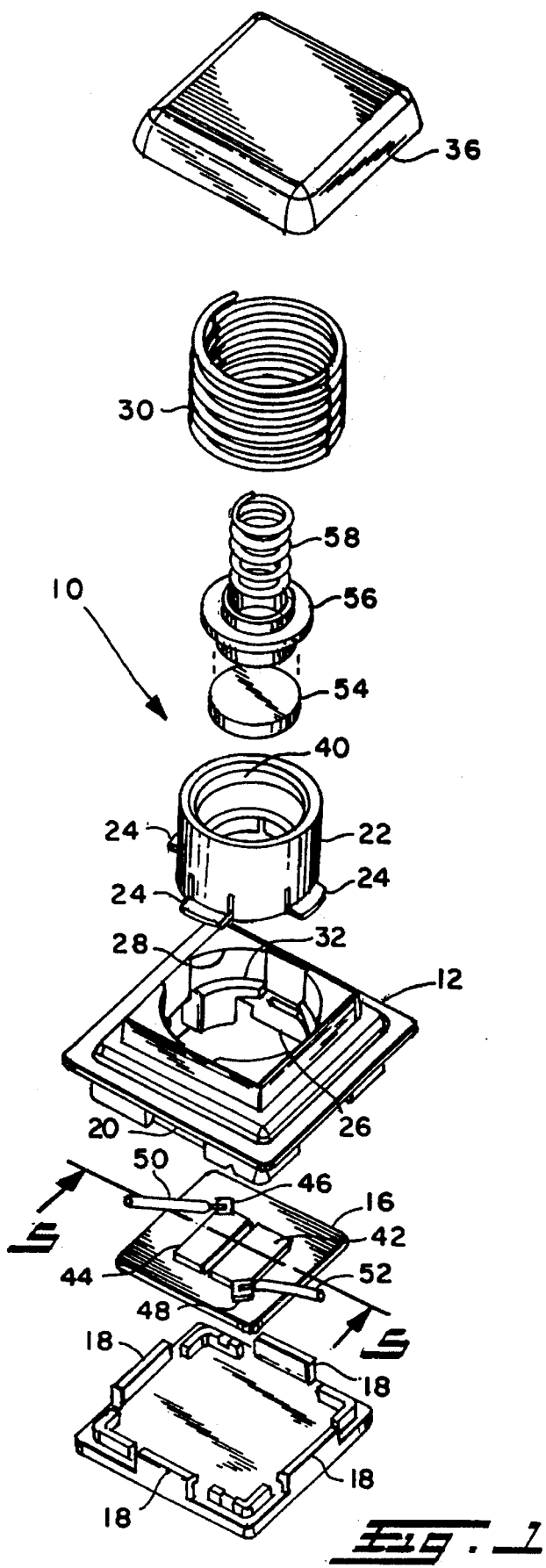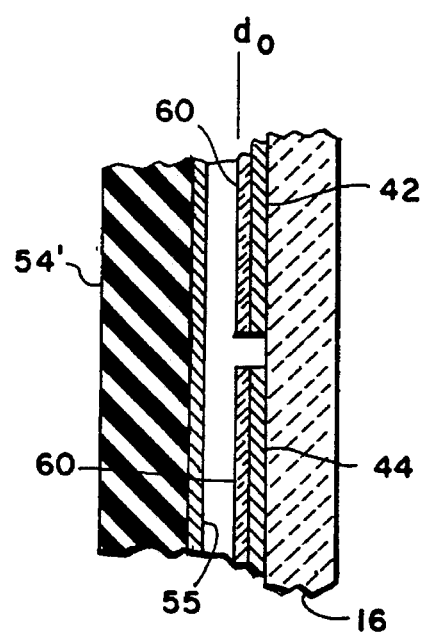

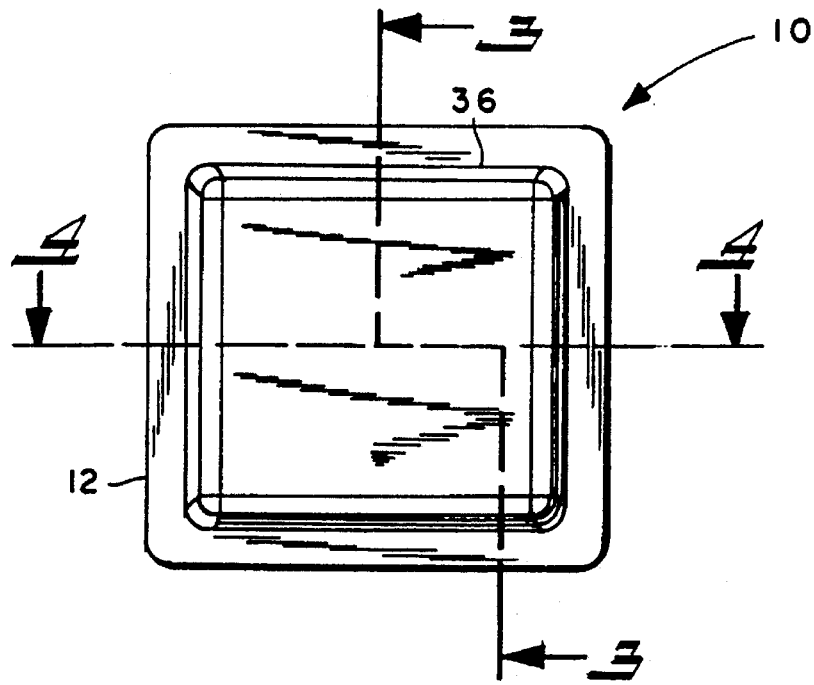
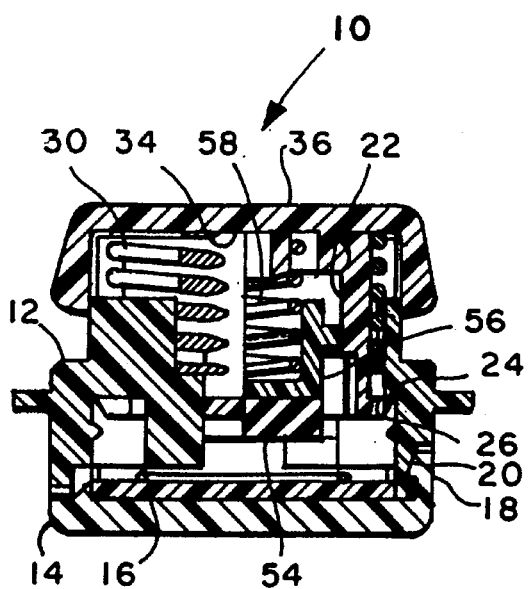
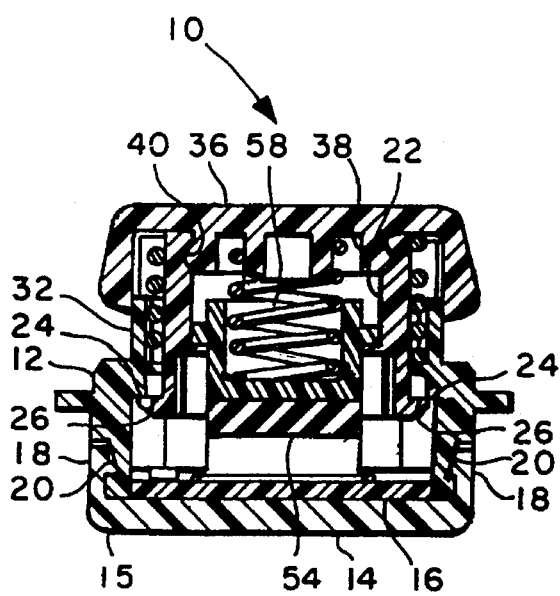

CAPACITIVE SWITCHING ASSEMBLY

BACKGROUND OF THE INVENTION

The present invention relates to switches of the type employed for switching fractional ampere current where it is desired to have a push-to-actuate type of operation. Switches of this type are desirable where low cost, compact size and minimal protrusion from a panel are desired.

Heretofore known low current switches have employed various techniques, one of which has been push-to-actuate switches which employ over-center or toggle spring mechanisms to move the contacts of the switch in response to user movement of the actuator. Such switches have proven to be widely used because of their positive making and breaking characteristics, but are relatively costly in high volume mass production because of the numerous discrete parts and costly noble metal contacts required for performing the switching operation and to minimize arcing upon breaking. Where fractional or subfractional ampere current is being switched, the need for noble metal or separate contacts for switching the current and preventing arcing is eliminated. Therefore, it has been desired to provide a simpler yet reliable and lower cost switch for low current switching element with fewer pans.

Heretofore, capacitance change type switching has been used for smooth panel switches where the user touches a laminant on the panel which effects a change in capacitance as between two plates which is then detected by appropriate circuitry and discerned as a switching operation. However, known capacitance switching has not provided for significant movement or tactilely discernible switching action to give positive feedback to the user that the switching has occurred. It has therefore been desired to provide a low current switching mechanism which is minimum in manufacturing cost and which provides the movement and tactilely discernible indication of movement similar to switching that of a mechanical contact type switch without the need for such contacts.

SUMMARY OF THE INVENTION

The present invention provides a push button actuated low-current switch which provides a tactically discernible indication of switch actuation by movement and increasing force and performs a switching operation by the significant detection of change in capacitance of a pair of series connected capacitors.

It is an object of the present invention to provide a switching operation by user compression of a resilient conductive pad in contact with dielectric coating on the surface on the pair of spaced coplanar plates and effects a change in capacitance of a pair of series capacitors by resilient compression of the pad.

It is a further object of the invention to provide capacitance change switching by moving a conductive elastomeric member into contact with dielectric material on the surface of a pair of spaced coplanar plates and compressing the elastomeric material to effect a change in capacitance which is detected for switching purposes.

The present invention employs a pair of relatively thin conductive plates or film on the surface of a non-conductive substrate with a coating of dielectric material over the exposed faces of the plates. A user moveable actuator or direct contact effects compression of a resilient conductive pad or disc which is in contact with the dielectric material and continued movement of the actuator effects compression of the elastomeric disc which brings about a change of capacitance of the plates which is detectable for effecting a switching function. In one embodiment the resilient pad is conductive elastomeric material and in another embodiment the pad is non-conductive elastomer with a thin conductive foil on the surface thereof.

BRIEF DESCRIPTION OF THE DRAWINGS

FIG. 1 is an exploded view of the switch assembly of the present invention;

FIG. 2 is a top view of the assembled switch of FIG. 1;

FIG. 3 is a section view taken along section indicating lines 3—3 of FIG. 2;

FIG. 4 is a section view taken along section indicating lines 4—4 of FIG. 2;

FIG. 5 is an enlarged view taken along section indicating lines 5—5 of FIG. 1;

FIG. 6 is a graphical plot of values of capacitance as a function of pad compression for the embodiment of FIG. 5.

FIG. 7 is another embodiment of the invention; and,

FIG. 8 is a graph similar to FIG. 6 for the embodiment of FIG. 7.

DETAILED DESCRIPTION

Figure 9A:
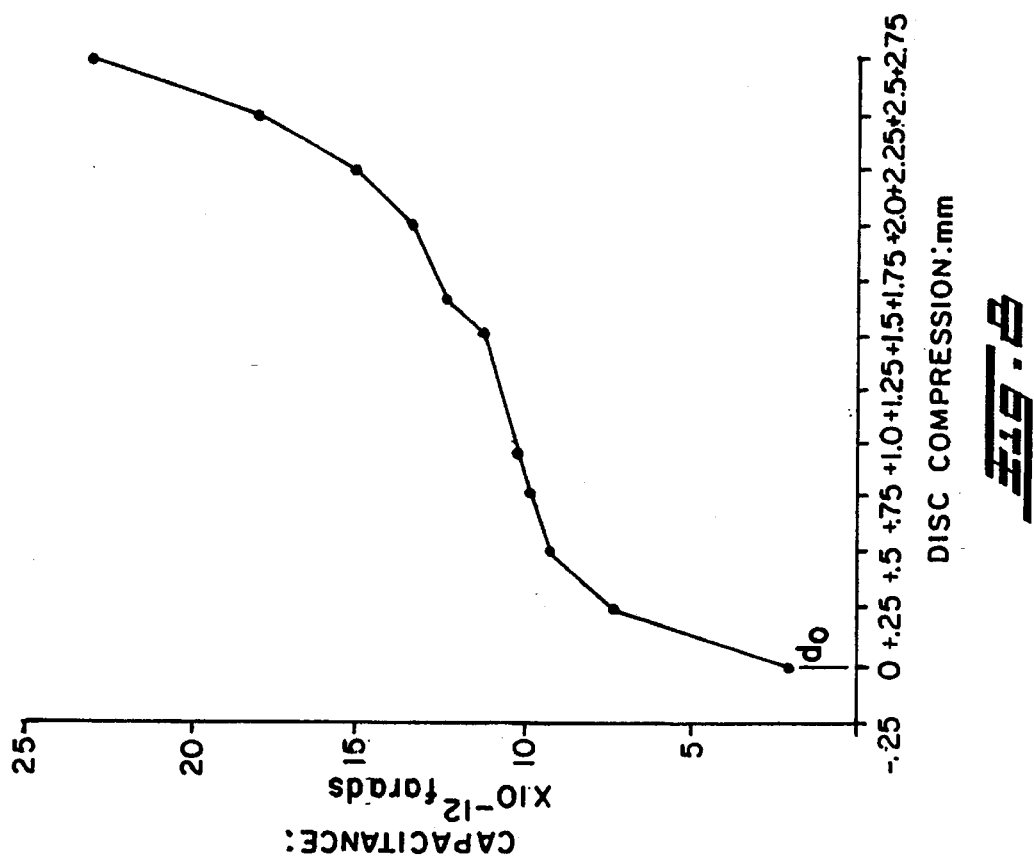
Figure 9B:
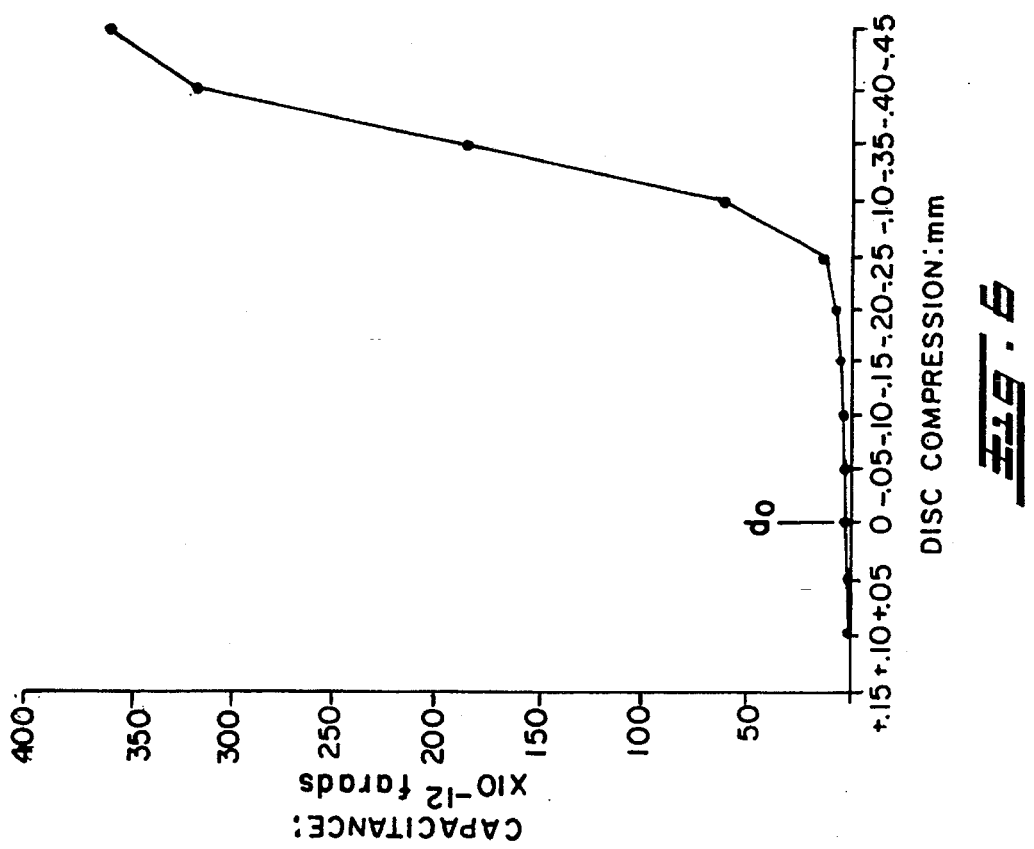

Referring to the drawings, the switch assembly indicated generally at 10 has a housing means comprising a main frame 12 and a cover 14 which is attached, preferably snap-locked, to the frame 12. A substrate or base 16 is sandwiched between the main frame 12 and cover 14 and secured therebetween. The cover 14 preferably has a plurality of tabs or projections 18 disposed thereabout which engage correspondingly disposed grooves 20 provided about the periphery of the lower portion of frame 12 in snap-locking engagement.

Frame 12 has attached thereto a preferably hollow cylindrical tower portion 22 which is attached to the mainframe 12 by snap-locking engagement of a plurality of lugs 24 disposed about the periphery of the tower 22 at or adjacent one end thereof. The tower 22 is nested in the frame 12 such that the lugs 24 engage an undercut or shoulder 26 provided therein. The tower portion 22 is slidably received in the counter-bore 28 formed in the frame 12 and a spring 30 is nested about the outer periphery of the tower 22. One end of the spring 30 is registered against an annular shoulder 32 provided in the bore 28.

The opposite end of spring 30 is registered against the under surface 34 of a push button 36 received over the end of the tower 22. Push button 36 has an annular registration portion 38 depending from the undersurface which is snap-lock engaged with a groove 40 formed in the inner periphery of the tower 22 for retaining the push button thereon.

Substrate or base 16 has a pair of plates 42,44 formed of conductive material and which may be thin film conductive material disposed in spaced coplanar arrangement, each having a tab or connector portion respectively 46,48 formed thereon for attachment of electrical leads thereto. If desired electrical connections may be made by soldering leads to the tabs 46,48 as denoted respectively by reference numerals 50,52 in FIG. 1.

The plates 42,44 are secured to the base 16 by any suitable adhesive or bonding arrangement. In the presently preferred practice of the invention, the substrate or base is formed of a refractory aluminum oxide material. The plates 42,44 are subsequently coated with a dielectric material and the subassembly thereof is fired at a temperature of 930° C. to cure the substrate plates and the dielectric material. In the presently preferred practice the electrode material is screened on the substrate and the dielectric is screened over the conductive material.

Referring to FIGS. 1 and 5, the substrate 16 has the plates 42,44 formed thereon preferably by screening of conductive ink formed of a mixture of palladium and silver; and, superposed thereon is a preferably screened layer of dielectric material denoted by reference numeral 60. In the present practice of the invention a mixture of ferroelectric and glass material has been found satisfactory for the dielectric and, in particular a material bearing manufacturer's design "D-4117" and obtained from Electroscience Laboratories, Inc., 416 East Church Road, King of Prussia, Pa. 19406, having a thickness in the range 40–60 microns ($10^{-6}$ meters). In the presently preferred practice, the conductive layers forming plates 42, 44 or 11.5 plus or minus 1.5 microns ($10^{-6}$ meters).

Referring to FIGS. 1, 3, 4 and 5, a switching member 54 or pad having a generally disc-shaped configuration and formed of resiliently deformable material is attached to the undersurface of a plunger member 56, preferably by adhesive bonding. The plunger is slidably received in the inner surface of the tower 22 and guided for movement therein. The plunger 56 is biased in a direction for movement towards the base 16 by one end of a spring 58 which has its opposite end registered against the undersurface of push button 36. In the present practice, elastomeric disc 54 of the embodiment shown in FIG. 5 is formed of silicon rubber interspersed with carbon to provide the desired conductivity and has a durometer of 60 measured on the shore "A" scale. A satisfactory material may be obtained from Stockwell Rubber Co., 4749 Tolbut Street, Philadelphia, Pa. 19136.

Referring to FIGS. 1 and 5, upon user movement of push button 36 toward the substrate 16, spring 58 is compressed pushing piston 56 and disc 54 toward the substrate until the disc 54 contacts the dielectric along the interface denoted $D_0$ in FIG. 5. Continued pressure on the push button by the user causes further compression of the springs 58,30 and effects some compression of the elastomeric material of disc 54.

Referring to FIG. 6, the capacitance measured between leads 50, 52 is plotted as a function of the compression of the elastomer after contact along line $D_0$. It will be seen from FIG. 6 that approximately 0.25 millimeters compression of the disc is required before a significant increase in capacitance occurs; and, an additional 0.15 millimeters compression provides orders of magnitude increase in capacitance which may be readily detected to provide a switching function.

Referring to FIGS. 7 and 8, another embodiment of the invention is illustrated wherein the elastomeric disc 54' is formed of elastomeric material having no conductivity; and, a conductive layer of metal foil 55 is cemented to the surface thereof to provide the completion of the two capacitors upon contact of the foil with the dielectric material 60 of plates 42, 44. In the present practice of the invention the elastomeric disc 54' is made of very low elastomeric sponge material having a relatively low durometer and has a thickness of 3.5 millimeters. The conductive foil 55 has a thickness of 0.06 millimeters and is preferably of aluminum material.

Referring to FIG. 8, which is a graph similar to FIG. 6, it will be seen that for the embodiment of FIG. 7, the capacitance change occurs significantly upon initial contact of the metal foil 55 with the dielectric 60 and thereafter a compression of only 0.25 millimeters gives a significant further increase; and, the capacitance increases tenfold upon a compression of the sponge material of the disc 54' by an amount of 2.75 millimeters.

The present invention thus provides a push-to-actuate switch assembly employing a resilient pad and conductive material pressed against the surface of dielectric material superposed over spaced coplanar plates to form a pair of series connected capacitors and, upon contact of the resilient pad with the dielectric material. Compression of the pad dramatically increases the capacitance in a manner which is readily detectible for effecting a switching function. In one embodiment the resilient pad is formed of conductive elastomer and in a second embodiment a nonconductive elastomer is coated with a thin conductive metal foil.

Although the invention has been illustrated with an actuator which moves the pad 54,54' from a position initially spaced from the dielectric coating over the plates 42,44, it will be understood that the actuator mechanism may be modified such that the pad 54,54' is initially in contact with the dielectric material at line $D_0$. It will also be understood that if desired the actuating mechanism may be omitted altogether and the pad surface exposed for direct contact by the user.

Although the invention has hereinabove been described with respect to the illustrated embodiments, it will be understood that the invention is capable of modification and variation and is limited only by the following claims.

We claim:

1. A capacitive switch assembly comprising:
   (a) housing means;
   (b) a pair of relatively thin conductive plates juxtaposed on said housing means in spaced coplanar arrangement, each of said plates having on a common side thereof dielectric material superposed thereon;
   (c) a carrier disposed for relative movement with respect to said housing means;
   (d) a switching member disposed on said carrier, said member formed of elastomer interspersed with carbon thereby becoming conductive material wherein the surface of said elastomer contacts said dielectric material upon said relative movement; and,
   (e) an actuator extending externally of said housing means and operable upon user movement thereof to effect said movement of said carrier to compress said switching member in contact with said dielectric and to form with said plates a pair of capacitors electrically in series wherein resilient deformation of said switching member changes the capacitance of said pair of capacitors, said change being electrically detectable.

2. The assembly defined in claim 1, wherein said switching member is formed of silicone rubber interspersed with carbon.

3. The assembly defined in claim 1, wherein said plates are formed on a substrate of a mixture of ferroelectric and glass.

4. The assembly defined in claim 1, wherein said carrier is slidably mounted on said housing means.

5. The assembly defined in claim 1, wherein said plates are formed on a substrate of fired alumina material.

6. The assembly defined in claim 1, wherein said plates are disposed on a substrate formed of aluminum oxide material.

* * * * *